(12) United States Patent
Lindström

(10) Patent No.: US 11,222,988 B2
(45) Date of Patent: Jan. 11, 2022

(54) PHOTOVOLTAIC DEVICE HAVING A LIGHT ABSORBING LAYER INCLUDING A PLURALITY OF GRAINS OF A DOPED SEMICONDUCTING MATERIAL

(71) Applicant: Exeger Operations AB, Stockholm (SE)

(72) Inventor: Henrik Lindström, Åkersberga (SE)

(73) Assignee: Exeger Operations AB, Stockholm (SE)

( * ) Notice: Subject to any disclaimer, the term of this patent is extended or adjusted under 35 U.S.C. 154(b) by 189 days.

(21) Appl. No.: 16/629,364

(22) PCT Filed: Jun. 29, 2018

(86) PCT No.: PCT/EP2018/067693
§ 371 (c)(1),
(2) Date: Jan. 8, 2020

(87) PCT Pub. No.: WO2019/011681
PCT Pub. Date: Jan. 17, 2019

(65) Prior Publication Data
US 2021/0135030 A1    May 6, 2021

(51) Int. Cl.
*H01L 31/028* (2006.01)
*H01L 51/44* (2006.01)
(Continued)

(52) U.S. Cl.
CPC ......... *H01L 31/028* (2013.01); *H01G 9/2009* (2013.01); *H01G 9/2045* (2013.01);
(Continued)

(58) Field of Classification Search
CPC ............. H01L 31/028; H01L 31/03529; H01L 31/072; H01L 31/0384; H01L 31/0481;
(Continued)

(56) References Cited

U.S. PATENT DOCUMENTS 6,653,701 B1 * 11/2003 Yamazaki ........... H01L 31/0322
257/414
2002/0040728 A1 * 4/2002 Yoshikawa .......... H01G 9/2031
136/263
(Continued)

FOREIGN PATENT DOCUMENTS

CN            1849413 A      10/2006
CN          201655556 U      11/2010
(Continued)

OTHER PUBLICATIONS

Saba et al., "Hierarchically Porous Polymer Monoliths by Combining Controlled Macro- and Microphase Separation," J. Am. Chem. Soc. (2015), 137: 8896-8899.
(Continued)

*Primary Examiner* — Golam Mowla
(74) *Attorney, Agent, or Firm* — Dilworth & Barrese, LLP

(57) ABSTRACT

The present invention relates to a photovoltaic device (10) comprising: a first conducting layer (16), a second conducting layer electrically insulated from the first conducting layer, a porous substrate (20) made of an insulating material arranged between the first and second conducting layers, a light absorbing layer (1) comprising a plurality of grains (2) of a doped semiconducting material disposed on the first conducting layer (16) so that the grains are in electrical and physical contact with the first conducting layer, and a charge conductor (3) made of a charge conducting material partly covering the grains and arranged to penetrate through the first conducting layer (16) and the porous substrate such that a plurality of continuous paths (22) of charge conducting material is formed from the surface of the grains (2) to the second conducting layer (18), wherein the first conducting layer (16) comprises a conducting material, an oxide layer (28) formed on the surface of conducting material, and an
(Continued)

insulating coating (29) made of an insulating material deposited on the oxide layer (28) so that the oxide layer and the insulating coating together electrically insulate said paths (22) from the conducting material of the first conducting layer (16).

15 Claims, 2 Drawing Sheets

(51) Int. Cl.
| | |
|---|---|
| *H01L 31/0352* | (2006.01) |
| *H01G 9/20* | (2006.01) |
| *H01L 31/048* | (2014.01) |
| *H01L 31/05* | (2014.01) |
| *H01L 51/42* | (2006.01) |
| *H01L 31/032* | (2006.01) |
| *H01L 31/0384* | (2006.01) |
| *H01L 31/072* | (2012.01) |
| *H01L 51/00* | (2006.01) |
| *H01L 31/18* | (2006.01) |

(52) U.S. Cl.
CPC ........ *H01L 31/032* (2013.01); *H01L 31/0384* (2013.01); *H01L 31/03529* (2013.01); *H01L 31/0481* (2013.01); *H01L 31/05* (2013.01); *H01L 31/072* (2013.01); *H01L 31/182* (2013.01); *H01L 51/0037* (2013.01); *H01L 51/4213* (2013.01); *H01L 51/44* (2013.01); *Y02E 10/542* (2013.01); *Y02E 10/549* (2013.01)

(58) Field of Classification Search
CPC ....... H01L 31/05; H01L 31/032; H01L 51/44; H01L 51/4213; H01G 9/2045; H01G 9/2009
See application file for complete search history.

(56) References Cited

U.S. PATENT DOCUMENTS

| | | | |
|---|---|---|---|
| 2003/0121543 A1* | 7/2003 | Gratzel | H01M 4/64 136/252 |
| 2007/0238216 A1* | 10/2007 | Park | H01L 31/02168 438/57 |
| 2010/0020051 A1 | 8/2010 | Triani et al. | |
| 2011/0308579 A1 | 12/2011 | Yun | |
| 2011/0308617 A1 | 12/2011 | Nakahara et al. | |
| 2012/0091105 A1 | 4/2012 | Ghandour | |
| 2013/0048077 A1 | 2/2013 | Kang et al. | |
| 2013/0199603 A1 | 8/2013 | Snaith et al. | |
| 2014/0238492 A1 | 8/2014 | Fukuura | |
| 2014/0251428 A1* | 9/2014 | Lindstrom | H01G 9/2022 136/256 |
| 2015/0083182 A1* | 3/2015 | Lindstrom | H01G 9/2068 136/244 |

FOREIGN PATENT DOCUMENTS

| | | |
|---|---|---|
| CN | 102194578 A | 9/2011 |
| CN | 105024013 A | 11/2015 |
| EP | 1630883 A2 | 3/2006 |
| EP | 2224534 A1 | 9/2010 |
| WO | 2013149787 A1 | 10/2013 |
| WO | 2014/179368 A1 | 11/2014 |
| WO | 2014/180780 A1 | 11/2014 |
| WO | 2014184379 A1 | 11/2014 |
| WO | 2015117795 A1 | 8/2015 |
| WO | 2015189551 A1 | 12/2015 |

OTHER PUBLICATIONS

Williams et al., "Conducting polymer and hydrogenated amorphous silicon hybrid solar cells," Appl. Phys. Lett. (2005), 87: 223504-1 to 223504-3.

Lee et al., "Quantum-Dot-Sensitized Solar Cell with Unprecedentedly High Photocurrent," Science Reports, (2013); 3:1050.

* cited by examiner

PHOTOVOLTAIC DEVICE HAVING A LIGHT ABSORBING LAYER INCLUDING A PLURALITY OF GRAINS OF A DOPED SEMICONDUCTING MATERIAL

FIELD OF THE INVENTION

The present invention relates to the field of photovoltaic devices, such as solar cells.

BACKGROUND OF THE INVENTION

Photovoltaic devices provide conversion of light into electricity using semiconducting materials that exhibit a photovoltaic effect.

A typical photovoltaic system employs solar panels, each comprising a number of solar cells, which generate electrical power. A solar cell or photovoltaic device is a device which directly converts sunlight into electricity. Light incident on the surface of the solar cell produces electric power. A solar cell has a light absorbing layer. When the energy of a photon is equal to or greater than the band gap of the material in the light absorbing layer, the photon is absorbed by the material and a photo-excited electron is generated. The front surface is doped in another way than the base, creating a PN-junction. Under illumination, photons are absorbed, thereby creating an electron-hole pair that is separated in the PN-junction. On the backside of the solar cell a metal plate collects excess charge-carriers from the base, and on the front side metal wires collect excess charge-carriers from the emitter.

Silicon is the most commonly used semiconductor material in solar cells. Silicon has several advantages, for example, it is chemically stable, and provides a high efficiency due to its high ability to absorb light. Standard silicon solar cells are made from thin wafers of doped silicon. A disadvantage with silicon wafers is that they are expensive.

The front surface of the silicon wafer is doped in another way than the base, creating a PN-junction. During production of the solar cell, a number of samples of doped silicon wafers must be cut or sawed from a silicon ingot, and then the samples of silicon wafers are assembled electrically to a solar cell. Since the silicon ingot must have extremely high purity and since the sawing is time-consuming and creates significant amounts of waste material, the production of such solar cells is expensive.

On the backside of a traditional solar cell a metal plate collects excess charge-carriers from the base, and on the front side metal grids and metal wires collect excess charge-carriers from the emitter. Thus, conventional silicon solar cells have a front-side contacted emitter. A problem with using current collecting grids and wires on the front side of the solar cell is that there is a trade-off between good current collection and light harvesting. By increasing the size of the metal wires, the conduction is increased and the current collection is improved. However, by increasing the size of the metal grids and wires more of the sun harvesting area is shaded, leading to a reduced efficiency of the solar cell.

A known solution to this problem is rear contact solar cells. US 2014166095 A1 describes how to make a back contact back junction silicon solar cell. Rear contact solar cells achieve higher efficiency by moving the front-side contacted emitter to the rear side of the solar cell. The higher efficiency results from the reduced shading on the front side of the solar cell. There exist several configurations of rear contact solar cells. For example, in back-contacted back-junction (BC-BJ) silicon solar cells, the emitter area and all wiring are placed on the backside of the solar cell resulting in effective removal of any shadowing components from the front side of the solar cell. However, the production of these BC-BJ silicon solar cells is both complex and costly.

WO 2013/149787 A1 discloses a dye-sensitized solar cell having a rear contact. The solar cell includes a porous insulating layer, a working electrode including a porous conducting metal layer formed on top of the porous insulating layer, and a light absorbing layer containing an adsorbed dye arranged on top of the porous conducting metal layer to face the sun. The light absorbing layer comprises $TiO_2$ metal oxide particles dyed by light absorbing dye molecules on the surface of the $TiO_2$ particles. The dye-sensitized solar cell further includes a counter electrode including a conducting layer disposed on an opposite side of the porous insulating layer. An electrolyte is filled between the working electrode and the counter electrode. An advantage of this solar cell is that it is easy and fast to manufacture, and accordingly it is cost effective to produce. A disadvantage of this type of solar cell compared to a silicon solar cell is that its maximum efficiency is lower due to the fact that the dye molecules have less ability to absorb light than silicon.

In a further development of the dye-sensitized solar cells, the efficiency of the cells has been augmented by the use of perovskites as a substitute to the dye infused $TiO_2$ layer. WO2014/184379 discloses a dye-sensitized solar cell having light absorbing layer comprising a perovskite. An advantage of using a perovskite is that higher solar cell efficiencies can be reached. However, perovskite solar cells have several disadvantages, for example, they are difficult to manufacture, expensive, unstable and environmentally hazardous.

In order to reduce the cost of solar cells it has been proposed to use silicon grains instead of solid silicon wafers.

U.S. Pat. No. 4,357,400 discloses a solar cell with doped silicon particles in redox electrolyte. The solar cell includes an insulating substrate having two conducting layers interleaved on one side of the substrate. Discrete semiconductor particles of one type of doping are positioned on one of the conducting layers, and semiconducting particles of an opposite type of doping are positioned on the other conducting layer. All is immersed in a redox electrolyte and encapsulated. The redox electrolyte contacts the particles, whereby a voltage potential is generated across the two conducting layers in response to photons impinging on the semiconductor particles. The conducting layers are thin layers of, for example, aluminium. The conducting layers are sputtered and etched on a substrate in a pattern, for example, with interdigitated fingers. The semiconducting particles can be applied by silk screening and glued to the surface of the conductors. A disadvantage with this solar cell is that the manufacturing process is complicated and time-consuming. Thus, the solar cell is expensive to manufacture.

CN20151101264 describes a traditional solar cell with a silicon wafer and front and back contacts. In order to improve fill factor and conversion efficiency luminous porous silicon particles are spin coated onto the surface of the silicon wafer of the solar cell. The silicon grains are prepared by electrochemical etching in HF and ethanol solution and thereafter grinded to 2-200 nm particle sizes. A disadvantage with this type of solar cell is that the silicon grains are attached to a silicon wafer thereby creating a large and voluminous silicon structure US2011/0000537 describes a solar cell having a light absorbing layer including hydrogenated amorphous silicon, a non-silicon based element and crystalline silicon grains embedded in the hydrogenated amorphous silicon based material.

JP2004087546 describes a method of forming a silicon film by using a composition containing Si particles. The Si particles are formed by crushing silicon ingots and milling the parts to suitable size. The particles are washed to remove silicon oxide and mixed with a dispersion medium. After application of the composition onto a glass substrate, the substrate is heat-treated and a silicon film is obtained.

OBJECT AND SUMMARY OF THE INVENTION

It is an object of the present invention to at least partly overcome the above-mentioned problems and to provide an improved photovoltaic device.

This object is achieved by a photovoltaic device as defined herein.

The photovoltaic device comprises a first conducting layer, a second conducting layer electrically insulated from the first conducting layer, a porous substrate made of an insulating material arranged between the first and second conducting layers, a light absorbing layer comprising a plurality of grains of a doped semiconducting material disposed on the first conducting layer so that the grains are in electrical and physical contact with the first conducting layer, and a charge conductor made of a charge conducting material partly covering the grains and arranged to penetrate through the first conducting layer and the porous substrate such that a plurality of continuous paths of charge conducting material is formed from the surface of the grains to the second conducting layer, wherein the first conducting layer comprises a conducting material, an oxide layer formed on the surface of conducting material, and an insulating coating made of an insulating material deposited on the oxide layer so that oxide layer and the insulating coating together electrically insulate the paths of charge conducting material from the conducting material of the first conducting layer.

The first conducting layer comprises an oxide layer formed on the surface of the conducting material. This oxide layer is formed by oxidizing the conducting material of the first conducting layer. The conducting material suitably comprises a metal or a metal alloy. The surface of the conducting material is oxidized when it is exposed to air. The oxide layer can be formed by performing a heat treatment of the first conducting layer in an oxidizing environment so that the conducting material becomes oxidized. The insulating oxide provides an electrically insulating layer on the conducting material, which at least partly prevents transfer of electrons or holes between the first conducting layer and the charge conductor. However, tests have shown that the oxide layer formed on the conducting material of the first conducting layer does not provide enough electrical insulation between the charge conductor and the first conducting layer, which may result in short circuit between the conducting layer and the charge conductor. Continuing the heating of the first conducting layer in contact with air will result in a thicker oxide layer. However, although the thickness of the oxide layer is increased, the oxide layer formed on the conducting material will still not provide enough electrical insulation between the charge conductor and the first conducting layer.

According to the invention, an insulating coating made of an insulating material is deposited on the oxide layer. This meant that insulating material is added to the surface of the conducting layer in order to achieve the coating, in contrary to the oxide layer, which is formed by oxidizing the conducting material of the conducting layer. Preferably, the insulating coating is deposited on the oxide layer so that the oxide layer is covered with the insulating coating. Test has proven that the oxide layer together with the insulating coating provide enough electrical insulation between the charge conductor and the conducting material of the first conducting layer to avoid short circuit between the charge conductor and the first conducting layer. For example, the insulating coating is deposited by chemical deposition.

Since the grains are in electrical and physical contact with the first conducting layer, and the oxide layer and the insulating coating can only cover the remaining free surface area of the first conducting layer.

The photovoltaic device can be produced at a low cost, is environmentally friendly, and has a high conversion efficiency. Such a photovoltaic device is significantly easier to manufacture compared to traditional methods for manufacturing of silicon solar cells based on wafers or thin films. Due to the fact that the grains are in direct physical and electrical contact with the first conducting layer, the distance the electrons have to travel before they are collected is short, and accordingly the probability for the electrons and holes to recombine before they are collected is low. This leads to high conversion efficiency.

The material of the light absorbing layer is significantly cheaper than the light absorbing layer of traditional silicon solar cells, since it can be made of powder including semiconductor grains instead of expensive wafers, and since the amount of semiconducting material needed is less than for traditional semiconductor solar cells. Suitably, the semiconducting material is silicon. However, other semiconducting material can also be used, such as CdTe, CIGS, CIS, GaAs, or perovskite. The material of the light absorbing layer is also cheaper than a light absorbing layer of a dye-sensitized solar cell, since a cheap semiconductor, such as silicon, can be used as a light absorber instead of more expensive dye molecules.

According to an aspect of the invention, the thickness of the insulating coating is larger than 10 nm, preferably larger than 50 nm, and most preferably larger than 100 nm.

According to an aspect of the invention, the thickness of the oxide layer is larger than 10 nm.

The oxide layer and the insulating coating can be made of different material, or they can be made of the same material but with different morphology.

According to an aspect of the invention, the oxide layer and the insulating coating have different morphology. With different morphology is meant that the form and/or structure, such as surface structure, of the oxide layer and the insulating coating are different. The morphology of the oxide layer and the insulating coating depends on the method used to produce the layer/coating. Thus, due to the fact that the oxide layer and the insulating coating are produced by different methods, they have different morphology. For example, the oxide layer and the insulating coating may consist of the same material but, with different morphology.

According to an aspect of the invention, the insulating coating is denser and has lower porosity than the oxide layer. Due to the higher density and lower porosity, the insulating coating has a higher ability to provide electrical insulation between the charge conductor and the first conducting layer than the oxide layer.

According to an aspect of the invention, the insulating coating is deposited on the oxide layer by chemical deposition. Chemical deposition, for example Chemical Vapor Deposition (CVD), is a well-known method to produce thin solid layers on surfaces. Chemical deposition involves the use of precursors, which react with and/or decompose on the surface to produce a desired deposit on the surface. A precursor is a compound that participates in a chemical reaction that produces another compound. An advantage with using chemical deposition for producing the insulating coating is that it provides a compact, intrinsically dense coating with low porosity, and consequently good electrical insulation between the charge conductor and the first conducting layer.

According to another aspect of the invention, the insulating coating is deposited on the oxide layer by settling of insulating particles onto the oxide layer. In this case, the insulating coating comprises insulating particles made of an insulating material. Preferably, the diameter of the insulating particles is less than 200 nm, and preferably less than 100 nm. The smaller diameter of the insulating particles, the denser and less porous coating is achieved. The insulating particles may originate from vapor, or a solution. For example, the insulating coating is deposited onto the oxide layer of the first conducting layer by printing. By printing a certain amount of an ink containing insulating particles on the first conducting layer it is possible to fill the pores in the first conducting layer with ink. By evaporating away the solvent of the ink, the insulating particles in the ink is deposited onto the available inner and outer surface of the first conducting layer. The dried ink coating can be heated to create an insulating coating that adheres to the insulating oxide on the surface of the first conducting layer.

According to an aspect of the invention, the conducting material of the first conducting layer comprises a metal or a metal alloy, and the oxide layer consists of a metal oxide.

According to an aspect of the invention, the oxide layer is formed by thermal treatment in air of the conducting material of the first conducting layer. The oxide layer can be formed by simply heating the conducting layer for some minutes.

According to an aspect of the invention, the insulating coating comprises, is made of, or consists of an oxide. For example, the insulating coating can be made of any of $TiO_2$, $Al_2O_3$, $ZrO_2$, MgO, CaO, $SiO_2$, $Ga_2O_3$, $Nb_2O_5$, $Ta_2O_5$, $CeO_2$, $SrTiO_3$, and $GeO_2$, or combinations thereof. An advantage by using an oxide in the insulating coating is that they have good electrically insulating properties.

According to an aspect of the invention, the insulating coating comprises, or is made of, or consists of any of $TiO_2$, $Al_2O_3$, $ZrO_2$, MgO, CaO, $SiO_2$, and aluminosilicate, or combinations thereof. Those materials have good electrically insulating properties. For example, the insulating coating is produced by deposition of precursor materials that are converted to $TiO_2$, $Al_2O_3$, $ZrO_2$, MgO, CaO, $SiO_2$, and aluminosilicate upon drying and heat treatment at elevated temperatures in oxygen containing environment such as air. Such precursor materials can form compact deposited insulating coating. Examples of such precursor materials are, e.g. organic titanates (for forming $TiO_2$) or organic zirconates (for forming $ZrO_2$) from the Tyzor™ family manufactured by DuPont. Other precursor materials could be silanes (for forming $SiO_2$) or aluminum chlorohydrate (for forming $Al_2O_3$).

According to an aspect of the invention, the insulating coating comprises, or is made of, or consists of Nitride, e.g., $Si_3N_4$, $Ge_3N_4$.

According to an aspect of the invention, the insulating coating comprises, or is made of, or consists of a polymer, e.g., PVDF, PTFE, polypropylene, polyethylene, polyamide, polyethylene terephtalate (PET), polybutylene terephtalate (PBT), nanocellulose, cellulose acetate etc.

According to an aspect of the invention, the first conducting layer comprises conducting particles made of the conducting material and arranged in electrical and physical contact with each other and the grains, and said oxide layer is formed on the surfaces of the conducting particles, which surfaces are not in contact with the grains or any of the other conducting particles. The conducting particles are bonded to each other, and the grains are bonded to the conducting particles. Suitably, the grains are made of silicon, and the conducting particles are made of metal or a metal alloy, For example, the conducting particles are made of titanium or an alloy thereof and the oxide layer consists of titanium oxide. Titanium is a suitable material to be used in the conducting layer due to its ability to withstand corrosion and because it can form a good electrical contact to silicon. A layer of titanium oxide is formed on the titanium particles during heat treatment of the particles in air. The conducting particles can also be made of aluminium or an alloy thereof and the oxide layer consists of aluminium oxide formed on the aluminium particles during heat treatment of the particles in air.

According to an aspect of the invention, the first conducting layer is porous, and the charge conductor is accommodated in pores of the first conducting layer, and in pores of the insulating substrate, so that the conducting paths are formed through the pores of the first conducting layer and the insulating substrate. The first conducting layer and the insulating substrate are porous allowing the charge conductor to be accommodated in pores of the first conducting layer, and in pores of the porous insulating substrate so that the charge conducting paths are formed from the light absorbing layer, through the first conducting layer and through the insulating substrate to the second conducting layer. A charge conducting path is a path made of a charge conducting material, as defined above, which allows transport of charges, i.e. electrons or holes. Further, the charge conducting material is applied so that it is in electrical contact with the second conducting layer. For example, the second conducting layer is disposed on the surface of the porous insulating substrate and by that the second conducting layer is in electrical contact with the charge conducting material accumulated in the pores of the insulating substrate.

The first and the second conducting layers are formed on different sides of the porous insulating substrate.

BRIEF DESCRIPTION OF THE DRAWINGS

The invention will now be explained more closely with reference to the appended figures.

DETAILED DESCRIPTION OF PREFERRED EMBODIMENTS OF THE INVENTION

Figure 1:
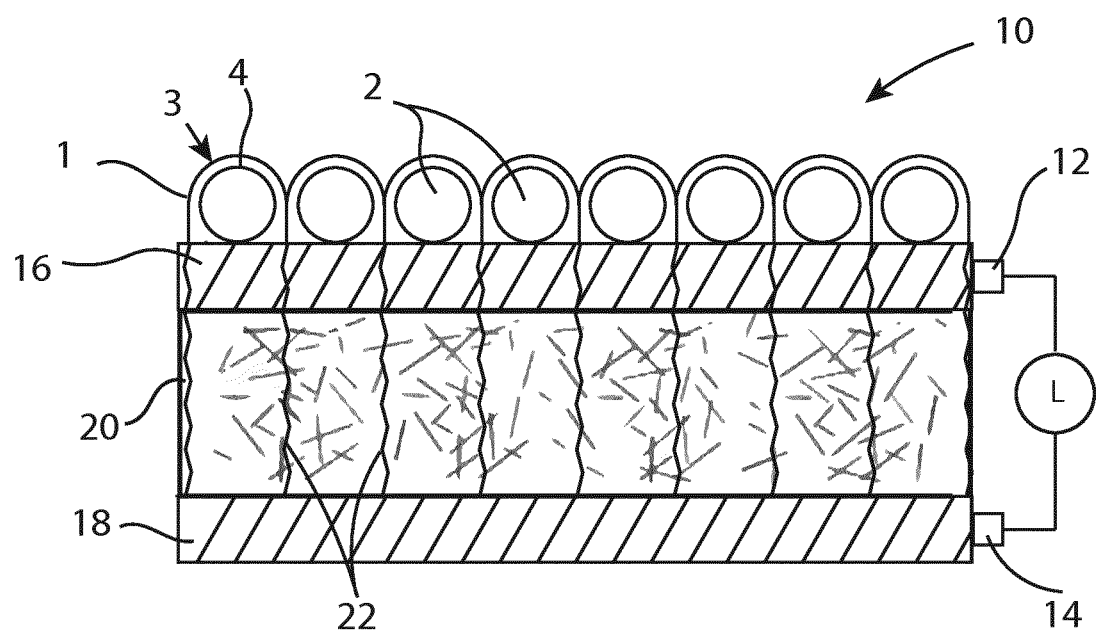
FIG. 1 shows schematically a cross-section though an example of a photovoltaic device according to the invention.

FIG. 1 shows schematically a cross-section though an example of a photovoltaic device 10 according to the invention. In this example, the photovoltaic device 10 is a solar cell. The photovoltaic device 10 comprises the light absorbing layer 1 comprises a plurality of grains 2 made of a doped semiconducting material, and an electric charge conductor 3 in physical and electrical contact with the grains 2. With a doped semiconductor is meant a semiconductor comprising a dopant, for example, boron (p-type), phosphor (n-type), or arsenic (n-type). To produce a doped semiconductor, a dopant is added to semiconductor. Depending on the type of dopant material, the semiconductor becomes p-doped or n-doped.

The grains are attached to the first conducting layer. Since part of the grain surface is in physical contact with the first conducting layer, the charge conductor can only partly cover the entire surface area of the grain. The remaining free surface areas of the grains are preferably covered with the charge conductor so that a plurality of junctions is formed between the grains and the charge conductor.

A charge conductor as used herein is made of a hole conducting material or an electron conducting material. In a hole conducting material the majority charge carriers are holes, and in an electron conducting material the majority charge carriers are electrons. A hole conducting material is a material that mainly allows transport of holes and that mainly prevents transport of electrons. An electron conducting material is a material that mainly allows transport of electrons and that mainly prevents transport of holes. The charge conductor serves several purposes. A main purpose is to provide junctions where electrons and holes can be separated. The junctions are interfaces between the grains and the charge conductor capable of providing separation of photo-excited electrons and holes. The grains are in electrical and physical contact with the charge conductor to form the junctions. Depending on the type of semiconducting material and the charge conducting material, the junctions can be homojunctions or heterojunctions. A second purpose is to conduct away one type of charge carrier from the junction. A third purpose is to bind the grains mechanically to each other and to bind the grains mechanically to the first conducting layer to form a mechanically robust photovoltaic device.

The photovoltaic device 10 further comprises a first conducting layer 16 in electrical contact with the grains 2 of the light absorbing layer 1, a second conducting layer 18 electrically coupled to the charge conductor 3, and an insulating layer 20 disposed between the first and second conducting layers 16, 18, to electrically insulate the first and second conducting layers. The light absorbing layer 1 is positioned on a top side of the photovoltaic device. The top side should be facing the sun to allow the sunlight to hit the grains 2 and generate photo-excited electrons. The first conducting layer 16 serves as a back contact that extracts photo-generated electrons from the light absorbing layer 1. The light absorbing layer 1 is disposed on the first conducting layer. Thus, the distance the excited electrons and/or holes need to travel until they are collected is short. A first contact 12 is electrically connected to the first conducting layer 16, and a second contact 14 electrically connected to the second conducting layer 18. A load L is connected between the contacts 12, 14. The first and second conducting layers 16, 18 are suitably metal layers made of metal or metal alloy, for example, titanium, or aluminium or an alloy thereof.

A junction 4 is formed in the contact area between the charge conductor 3 and the grains 2. The grains 2 are partly covered with the charge conductor 3 so that a plurality of junctions 4 are formed between the grains and the charge conductor. Preferably, at least 50% of the surface of the grains 2 is covered with the charge conductor.

The semiconducting material of the grains 2 has the ability to absorb photons, which excite electrons from a valence band to a conduction band and by that create electron-hole pairs in the semiconducting material. Suitably, the semiconducting material is silicon. However, other semiconducting material can also be used, such as CdTe, CIGS, CIS, GaAs, or perovskite. Preferably, the average size of the grains is between 1 µm and 300 µm, and typically, the average size of the grains 2 is between 20 µm and 100 µm.

The charge conductor 3 is made of a solid material, i.e. not liquid, and can be a hole conductor or an electron conductor. If the grains are n-doped, the charge conductor 3 preferably is a hole conductor, and if the grains are p-doped, the charge conductor 3 preferably is an electron conductor. The charge conductor 3 is made of a charge conducting material, for example, a doped semiconducting material, such as silicon, or an organic conducting material, such as a conducting polymer. Several transparent, conductive polymers with sufficient conductivity may be used for this purpose. An example of a suitable hole conducting polymer to be used in combination with silicon grains is poly (3,4-ethylenedioxythiophene) polystyrene sulfonate (PEDOT:PSS). PEDOT: PSS is a polymer mixture of two ionomers. Other examples of suitable material for the charge conductor 3 are polyaniline, P3HT and Spiro-OMeTAD. The junctions 4 have the ability to provide separation of the pairs of photo-excited electrons and holes. Depending on the materials of the grains and the charge conductor, the junctions are homojunctions, such as p-n-junctions, or heterojunctions.

A homojunction is an interface between similar semiconductor materials. These materials have equal band gaps but typically have different doping. For example, a homojunction occurs at the interface between an n-doped and p-doped semiconductor, a so called a PN junction.

A heterojunction is the interface between any two solid-state materials, including crystalline and amorphous structures of metallic, insulating, fast ion conductor and semiconducting materials. The two solid-state materials can be made of a combination of two inorganic materials or a combination of two organic materials or a combination of one inorganic and one organic material.

The grains 2 are essentially evenly distributed in the light absorbing layer, and the charge conductor 3 is located on the grains and in the space between the grains. The size and shape of the grains 2 may vary. The light absorbing layer 1 is applied to a conducting layer 8. For example, the layer 8 is a conducting layer. The grains 2 are in physical as well as electrical contact with the layer 8. A lower portion of the grains may be protruding into the conducting layer 8.

In the example shown in FIG. 1, the charge conductor 3 is an organic conductor. The charge conductor is disposed on the surfaces of the grains 2 so that a charge conducting layer 6 is formed on the grains. Thus, the surface of each of the grains 2 is partly covered with the charge conducting material. Preferably, the charge conducting layer 6 has a thickness between 10 nm and 200 nm. Typically, the charge conducting layer 6 has a thickness between 50 nm and 100 nm. The charge conductor 3 is disposed between the grains so that the grains are bonded to each other by means of the charge conductor. Thus, the charge conductor increases the mechanical strength of the light absorbing layer. The charge conducting layer 6 is a mono layer. Each of the grains has an upper surface facing the incident light and a lower surface in direct physical and electrical contact with the conducting layer 8. The upper surface of the grains is wholly or at least partly covered with the charge conductor 3, and the lower surface is free from charge conductor to enable electrical contact with a first conducting layer 16.

The device 10 further comprises a plurality of charge conducting paths 22 of a charge conducting material disposed between the light absorbing layer 1 and the second conducting layer 18 to enable charges, i.e. holes or electrons, to travel from the light absorbing layer 1 to the second conducting layer 18. The conducting paths 22 are suitably, but not necessarily, made of the same material as the charge conducting layers 6 on the grains. In this embodiment, the charge conductor 3 forms the layers 6 on the grains as well as the conducting paths 22. The conducting paths 22 penetrate through the first conducting layer 16 and the insulating layer 20. Suitably, the first conducting layer 16 and the insulating layer 20 are porous to allow the charge conductor to penetrate through the first conducting layer and the insulating layer 20 to form the paths 22 to the second conducting layer. The charge conductor 3 can be accommodated in pores of the first conducting layer 16, and in pores of the insulating layer 20. In an embodiment of the invention, the second conducting layer 18 can be porous and the charge conductor 3 can be accommodated in pores of the second conducting layer 18.

The insulating layer 20 may comprise a porous insulating substrate. For example, the porous insulating substrate is made of a glass microfiber or a ceramic microfiber. The first conducting layer 16 is disposed on an upper side of the porous insulating substrate, and the second conducting layer 18 is disposed on a lower side of the porous insulating substrate. The light absorbing layer 1 is disposed on the first conducting layer 16.

A portion of the surface of each of the grains is in physical and electrical contact with the first conducting layer, and the predominant part of the remaining free surface of each of the grains is covered with the charge conductor. Each of the grains has an upper part covered with the charge conductor, and a lower part in physical and electrical contact with the first conducting layer. It is important that the lower part of the grains, which is in electrical contact with the first conducting layer, does not form a low ohmic junction with the charge conductor, in order to avoid electrical short circuit. If the electrical resistance between the charge conductor and the lower part of the grain is too low, then the losses due to short circuit will be too high. Thus, the parts of the surfaces of the grains, which are in electrical contact with the first conducting layer, should not be covered with the charge conductor. Preferably, the remaining surface of the grain is covered with the charge conductor to achieve a high conversion efficiency. Ideally, the charge conductor covers the entire remaining free surface of the grains.

The first conducting layer collects the photo-excited electrons from the junctions and transports the electrons to an external circuit outside the photovoltaic device. Due to the fact that the grains are in direct physical and electrical contact with the first conducting layer, the distance the electrons have to travel before they are collected is short, and accordingly the probability for the electrons and holes to recombine before they are collected is low. Thus, an advantage with a photovoltaic device according to the invention, compared to a traditional photovoltaic device, is that the electrical resistive losses in the light absorbing layer are less, due to the shorter distance for the electrons to travel before they are collected. The distance for charge carriers to be collected by the first conducting layer ranges typically from a few micrometres to tens of micrometres, whereas in a traditional silicon wafer solar cell the electrons typically need to travel several thousands of micrometres, i.e. several millimetres, to reach the front side current collector or several hundred micrometres to reach the back side current collector.

Figure 2:
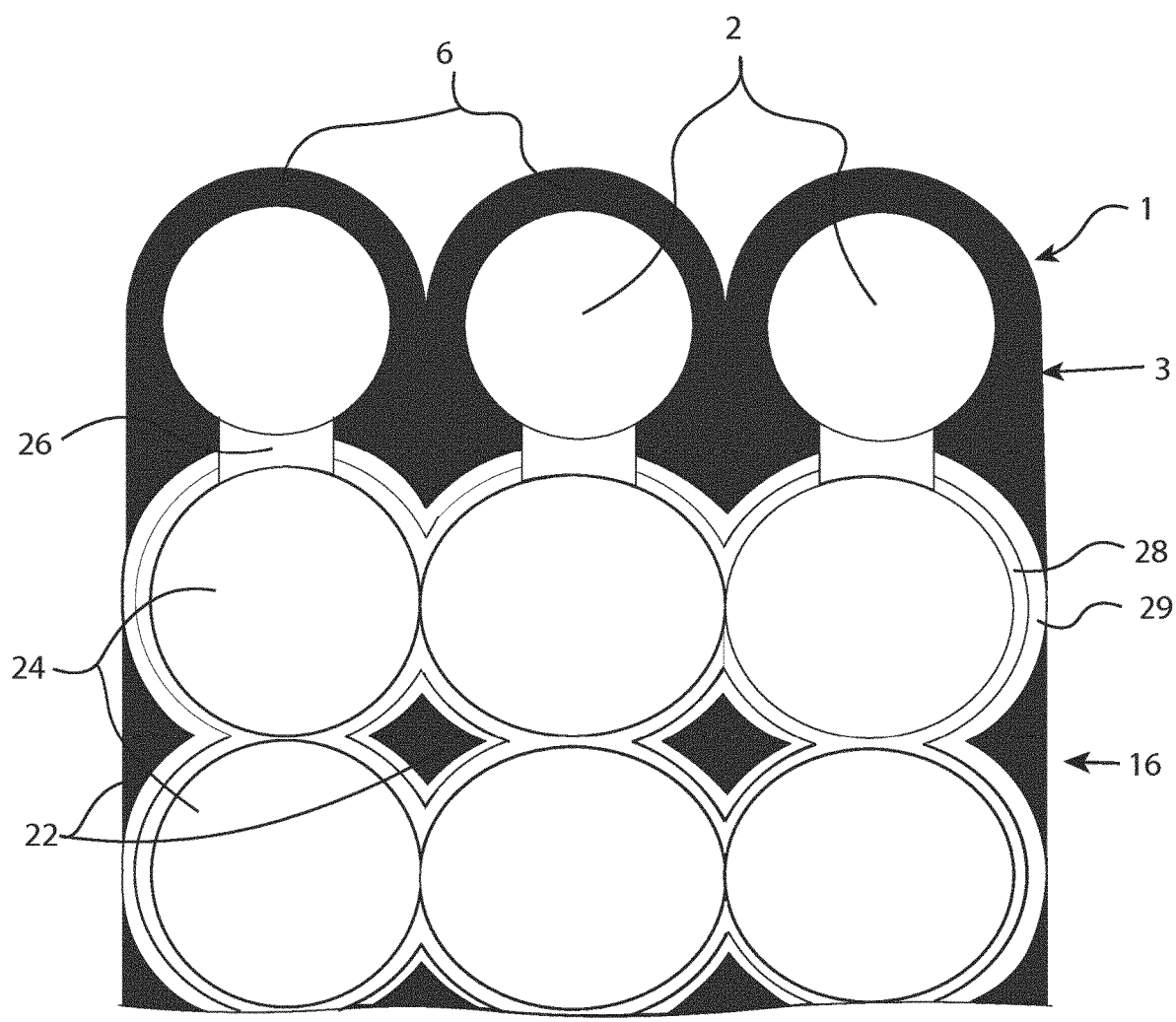
FIG. 2 shows an enlarged view of a part of a first example of the photovoltaic device.

FIG. 2 shows an enlarged view of a part of a first example of the photovoltaic device 10 including the light absorbing layer 1 and the first conducting layer 16. In this embodiment, the first conducting layer 16 comprises a plurality of conducting particles 24 made of a conducting material bonded to each other. The conducting material of the conducting particles 24 are suitably metal or a metal alloy, for example, titanium or aluminium or an alloy thereof. The conducting particles 24 of the first conducting layer are in physical and electrical contact with each other. The grains 2 are in physical and electrical contact with some of the conducting particles 24 of the first conducting layer. Preferably, the grains 2 have a size less than 100 μm in order to provide a sufficient contact area between the grains and the particles 24 of first conducting layer 16. The grains 2 have an upper portion facing away from the photovoltaic device and a lower portion in physical contact with the conducting particles 24 of the first conducting layer. The upper portions of the grains 2 are covered with the conducting layers 6 of the charge conductor 3.

The grains are preferably made of doped silicon, and a zone of physical contact between the silicon grains 2 and the conducting particles 24 of the first conducting layer may consists of a layer 26 of metal-silicon alloy or metal silicide in order to provide good electrical contact between the grains 2 and the conducting particles 24. For example, the grains 2 are made of silicon (Si) and the conducting particles 24 are made of titanium (Ti), or at least partly comprise titanium, and the boundaries between the grains 2 and the particles 24 comprise a layer 26 of titanium silicide, which provides good electrical contact between Si and Ti.

Due to the fact that the first conducting layer 16 is formed by a plurality of conducting particles 24 bonded to each other, cavities are formed between the particles. Thus, the first conducting layer 16 allows the charge conductor 3 to extend through the first conducting layer to form the plurality of charge conducting paths 22. The charge conductor 3 is accommodated in some of the cavities formed between the conducting particles 24 in the first conducting layer 16.

In order to avoid electrical contact between the first conducting layer 16 and the conducting paths 22 of the charge conductor 3, an oxide layer 28 is formed on the surface of the particles 28, and an insulating coating 29 made of an insulating material is deposited on the oxide layer 28 so that the oxide layer and the insulating coating together electrically insulate the paths 22 of charge conducting material from the conducting material of the first conducting layer. The oxide layer 28 is formed by oxidizing the conducting particles 24 during manufacturing of the photovoltaic device 10. The oxide layer 28 is formed on the parts of the surfaces of the conducting particles 24, which are neither in contact with the grains 2 nor in contact with the other conducting particles 24 in the first conducting layer. Preferably, the insulating coating 29 is deposited on the oxide layer 28 so that the entire oxide layer is covered with said insulating coating.

Suitably, the conducting particles comprises metal or a metal alloy, and the oxide layer comprises a metal oxide. For example, if the conducting particles comprise titanium, the parts of the surfaces of the titan particles, which are not in contact with the grains, are covered with a layer of titanium oxide ($TiO_2$). For example, if the conducting particles comprise aluminium, the parts of the surfaces of the conducting particles, which are not in contact with the grains, are covered with aluminium oxide ($Al_2O_3$).

In one aspect, the thickness of the insulating coating 29 is larger than 10 nm, more preferably larger than 50 nm, and most preferably larger than 100 nm. In one aspect, the thickness of the oxide layer 28 is larger than 10 nm. The maximum allowed total thickness of the oxide layer and the insulating coating depends on the porosity of the first conducting layer. There must remain enough space in the pores to accommodate the charge conducting material of the paths 22. A larger pore size of the first conducting layer allows a larger total thickness of the oxide layer and the insulating coating. Thus, the total volume of the oxide layer and the insulating coating should be less than the total volume of the pores the first conducting layer. Preferably, the remaining volume of the pores is filled with the charge conducting material.

Preferably, the insulating coating 29 is denser and has lower porosity than the oxide layer 28. For example, the oxide layer is formed by thermal treatment of the conducting material of the first conducting layer in an oxidizing environment, and the insulating coating is deposited on the oxide layer by chemical deposition and/or deposition of particles of an insulating material. Due to different manufacturing methods, the oxide layer and the insulating coating have different morphology. The oxide layer and the insulating coating can be made of different material or of the same material. Although the oxide layer and the insulating coating are made of the same material, their morphology is different. In one aspect, the conducting material of the first conducting layer comprises a metal or a metal alloy, and the oxide layer consists of metal oxide. In one aspect, the insulating coating is made of an oxide. The insulating coating can be made of any of $TiO_2$, $Al_2O_3$, $ZrO_2$, MgO, CaO, $SiO_2$, and aluminosilicate, or combinations thereof. The insulating coating can also be made of other electrically insulating materials or combination or mixtures of materials, such as $Ga_2O_3$, $Nb_2O_5$, $Ta_2O_5$, $CeO_2$, $SrTiO_3$, $GeO_2$, Nitrides, e.g., $Si_3N_4$, $Ge_3N_4$, or polymers like, e.g., PVDF, PTFE, polypropylene, polyethylene, polyamide, polyethylene terephtalate (PET), polybutylene terephtalate (PBT), nanocellulose, cellulose acetate etc.

The charge conducting paths 22 of the charge conductor 3 are in contact with the insulating coating 29 on the particles 24, as shown in FIG. 2. The insulating coating 29 and the oxide layer 28 prevents that charges are transferred between the first conducting layer 16 and the paths 22 of the charge conductor 3, and thereby prevents short circuit between the first conducting layer 16 and the charge conductor 3.

In one aspect, the insulating coating comprises insulating particles made of an insulating material, and the diameter of the insulating particles is less than 200 nm, and preferably less than 100 nm. The coating can be deposited, e.g. by printing an ink containing particles of, e.g. $TiO_2$, $Al_2O_3$, $ZrO_2$, aluminosilicate, $SiO_2$, on top of the first conducting layer. If particles are used in the ink the deposited insulating coating can be porous. The particles should have a diameter that is smaller than the pores of the first conducting layer. If the pores in the first conducting layer are around 1 μm then the particles should preferentially have a diameter that is 100 nm or smaller.

Alternatively, instead of using an ink that contains particles, the printing ink can contain precursor materials that are converted to, e.g. $TiO_2$, $Al_2O_3$, $ZrO_2$, aluminosilicate, $SiO_2$, upon drying and heat treatment of the deposited ink at elevated temperatures in oxygen containing environment such as air. Such precursor materials can form compact deposited insulating coating. Examples of such precursor materials are, e.g. organic titanates (for forming $TiO_2$) or organic zirconates (for forming $ZrO_2$) from the Tyzor™ family manufactured by DuPont. Other precursor materials could be silanes (for forming $SiO_2$) or aluminum chlorohydrate (for forming $Al_2O_3$).

The second conducting layer 18 may also comprise conducting particles. The conducting particles of the second conducting layer 18 are suitably metal particles made of metal or metal alloy, for example, titanium, aluminium, or an alloy thereof. In this example, the conducting particles (not shown) of the second conducting layer 18 are made of aluminium, and the aluminium particles are not covered with any insulating layer, and accordingly, the charge conductor is allowed to be in electrical contact with the particles of the second conducting layer 18. The conducting particles of the first and second conducting layers 16, 18 are sintered to form the conducting layers. The conducting particles in each of the conducting layers 16, 18 are in electrical contact with each other to form a conducting layer. However, there is also space between the conducting particles to accommodate the charge conductor 3. The junctions 4 on the grains 2 of the light absorbing layer are in electrical contact with the paths 22 of charge conducting material, which are in electrical contact with conducting particles in the second conducting layer 18.

In one example, the grains 2 are made of n-doped silicon, the first and second conducting layers include conducting particles 24 made of titanium, and the charge conductor 3 is a hole conducting polymer. For example, the hole conducting polymer is PEDOT:PSS, in the following denoted PEDOT. PEDOT is a hole conductor and transports holes to the second conducting layer 18. The n-doped silicon grains are electron conductors and transport electrons to the first conducting layer. The first conducting layer then transports the electrons to the second conducting layer via an external electrical circuit. The first and second conducting layers 16, 18 are separated physically and electrically by the insulating layer 20. The silicon grains 2 of the light absorbing layer 1 are bonded to the conducting particles. The conducting particles 24 in the first conducting layer 16 are in physical and electrical contact with each other, and the conducting particles in the second conducting layer 18 are in physical and electrical contact with each other. The charge conductor 3 is arranged in physical and electrical contact with the grains 2 of the light absorbing layer 1.

In the following, an example of a method for manufacturing a photovoltaic device according to the invention will be described.

Step 1: Forming a porous first conducting layer on one side of a porous insulating substrate. The forming of the first porous conducting layer can be done in different ways. For example, it can be done by spraying or printing with an ink including conducting particles on one side of the porous insulating substrate. The conducting particles can, for example, be made from titanium or an alloy thereof, or aluminium or an alloy thereof. The porous insulating substrate can, for example, be a porous glass microfiber based substrate. Preferably, the conductive particles are larger than the pores of the porous insulating substrate to avoid that the particles penetrate through the porous insulating substrate.

Step 2: Coating the first conducting layer with a layer of grains of a doped semiconducting material to form a structure. In this example, the structure comprises the porous insulating substrate, the first conducting layer, and the layer of grains. The grains are made of a doped semi-conducting material, such as doped silicon. The coating is preferably done so that the surface of the first conduction layer is covered by a monolayer of grains. This can be done by applying a liquid, for example an ink, containing powder of grains onto the first conducting layer. The deposition of the grains can be done by, for example, printing or spraying. Suitable spraying techniques are, e.g. electrostatic spraying or electro spraying. The silicon particles may be etched in a separate step before deposition on the first conducting layer.

The average size of the grains is suitably between 1 μm and 300 μm, preferably between 10 μm and 80 μm, and most preferably between 20-50 μm. The powder of grains can, for example, be produced by grinding. The grinding can, for example, be done by using a disc-type or a cone-type mill. The size and shape of the grains produced during the grinding depends on selected grinding process parameters, such as milling time, milling speed etc. The average size of the grains can be controlled by regulating the grinding process parameters. The average particle size of the powder can, for instance, be measured by using a mesh. The use of meshes for measuring the average particle size of a powder is well-known.

Step 3: Performing a first heat treatment of the structure to bond the grains to the first conducting layer, e.g. to the conducing particles of the first conducting layer. The first heat treatment also bonds the conducting particles in the first conducing layer to each other. Preferably, the heat treatment is performed in a non-oxidizing environment. For example, the structure is heat treated in vacuum with a temperature above 550° C. during at least two hours. The first heat treatment is, for example, done by vacuum sintering of the structure. During this step, the grains and the conducting particles are vacuum sintered. During the sintering, the grains bond to the conducting particles of the first conducting layer to achieve mechanical and electrical contact between them. Also, during vacuum sintering the conducting particles are sintered together to form a first conducting layer with mechanical and electrical contact between the conducting particles.

Step 4: Forming an electrically insulating layer on surfaces of the first conducting layer. This step may include performing a second heat treatment of the structure in an oxidizing environment to form an oxide layer on the available surfaces of the first conducting layer, e.g. on the parts of the surfaces of the conducting particles, which are not in physical contact with the other conducting particles or the grains. The oxidizing environment is, for instance, air. The second heat treatment of the structure can be performed at, e.g. 500 C for 30 minutes.

Step 5: Depositing a thin insulating coating onto the oxide layer of the first conducting layer. For example, the insulating coating is deposited by printing. By printing a certain amount of an ink containing insulating material on the first conducting layer it is possible to fill the pores in the first conducting layer with ink. By evaporating away the solvent of the ink, the insulating material in the ink is deposited onto the available inner and outer surface of the first conducting layer. The dried ink coating can be heated to create an insulating coating that adheres to the available surface of the first conducting layer. The coating can be deposited, e.g. by printing an ink containing particles of, e.g. $TiO_2$, $Al_2O_3$, $ZrO_2$, $CaO$, $MgO$, $SiO_2$, or aluminosilicate on top of the oxide layer of the first conducting layer. If particles are used in the ink, the deposited insulating coating can be porous. The particles should have a diameter that is smaller than the pores of the first conducting layer. If the pores in the first conducting layer are around 1 μm, then the particles should preferentially have a diameter that is 100 nm or smaller.

Alternatively, instead of using an ink that contains particles, the printing ink can contain precursor materials that are converted to, e.g. $TiO_2$, $Al_2O_3$, $ZrO_2$, $CaO$, $MgO$ $SiO_2$, or aluminosilicate upon drying and heat treatment of the deposited ink at elevated temperatures in oxygen containing environment such as air. Such precursor materials can form compact deposited insulating coating. Examples of such precursor materials are, e.g. organic titanates (for forming $TiO_2$) or organic zirconates (for forming $ZrO_2$) from the Tyzor™ family manufactured by DuPont. Other precursor materials could be silanes (for forming $SiO_2$) or aluminum chlorohydrate (for forming $Al_2O_3$).

It is also possible to mix both particles and precursors in the ink for creating an insulating layer on the available surface of the first conducting layer.

By carrying out the second heat treatment as well as the coating of the surfaces it is ensured that the first conducting layer is electrically insulated from the charge conducting material.

Step 6: Forming a second conducting layer. The formation of the second conducting layer can be done at different points in time relative to the other steps depending on the chosen method for forming the second conducting layer. The second conducting layer can be formed in many different ways. In one embodiment, the second conducting layer could be a porous conducting layer formed on an opposite side of the porous insulating substrate. For example, the second conducting layer can be formed by depositing an ink including conducting particles onto the opposite surface of the insulating substrate. In this embodiment, the formation of the second conducting layer can be done before performing the heat treatment in step 3, and even before step 2 or before step 1. Alternatively, the second conducting layer could be formed on a second insulating substrate, and in a next step, the second insulating substrate is attached to the first substrate. Alternatively, the second conducting layer can be an electrically conducting foil that is brought in electrical contact with the charge conducting material. The conducting foil can, e.g. be a metal foil. In this case, the formation of the second conducting layer can be done after step 7.

Step 7: Applying a charge conducting material onto the surface of the grains, inside pores of the first conducting layer, and inside pores of the insulating substrate. The charge conducting material is, for instance, any of a conducting polymer, an inorganic material, and a metal-organic material. The application of the charge conducting material can be done by, for example, applying a liquid base solution containing particles of the charge conducting material onto the surface of the grains so that the solution penetrates into the pores of the first conducting layer, and into the pores of the insulating substrate, and drying the structure so that a layer of solid charge conductor is deposited on the grains and a solid charge conductor is deposited inside the pores of the first conducting layer and the pores of the insulating substrate. Alternatively, the deposition of the charge conducting material can be performed in several steps. For example, the solution with the charge conducting material can first be sprayed onto the grains followed by drying off the solvent to yield a dry solid layer of the charge conducting material on the surface of the grains. In a second step the opposite side of the structure is sprayed with a solution of the charge conducting material. The application of the solution containing the charge conducting material can be done by, for example, soaking or spraying, e.g. ultrasonic spraying. The charge conductor on the surface of the grains covers, for example, at least 50%, and more preferably at least 70%, of the available surface of the grains, and most preferably at least 80% of the surface of the grains. The available surface of the grains is the part of the surface not in contact with the first conducting layer.

Step 8: Electrically connecting the charge conducting material to the second conducting layer. Step 8 can be a part of or a consequence of the steps 5 or 7, or it can be carried out in a separate step. For example, the charge conducting material is applied so that it is in electrical contact with the second conducting layer during step 7. If the second conducting layer is disposed on the surface of the porous insulating substrate, the second conducting layer is in electrical contact with the charge conducting material accumulated in the pores of the insulating substrate. If a second porous insulating substrate is arranged between the first porous insulating substrate and the second conducting layer, and the pores of the second porous insulating substrate are filled with the charge conducting material, the charge conducting material is in electrical contact with the second conducting layer. In those cases, the charge conducting material becomes electrically connected to the second conducting layer when the charge conducting material has been applied to the pores of the porous insulating substrate(s). If the second conducting layer is an electrically conducting foil that is brought in electrical contact with the charge conducting material, the charge conducting material and the second conducting layer are electrically connected during step 6.

The electrical connection of the charge conducting material and the second conducting layer can, for example, be carried out by providing a connection site on the second conducting layer, and electrically connecting the connection site and the charge conducting material. The connection site is physically and electrically connected to both the second conducting layer and the charge conducting material. For example, the connection site comprises a layer of silver (Ag) disposed on the second conducting layer. Alternatively, the second conducting layer may comprise conducting particles made of silver, or another conducting material that do not oxidize during a second heat treatment, which particles form a connection site. It is suitable to use silver, since it provides good electrical contact both with titanium and PEDOT. Another advantage with using silver is that silver prevents formation of oxide on the titanium particles of the second conducting layer in the area of contact between the titanium particles and the connection site. A layer of titanium silver (AgTi) is formed between the titanium particles of the second conducting layer and the connection site during the formation of the layer of silver. Thus, the PEDOT can form a good low ohmic contact with silver and the silver can form a good low ohmic contact with titanium via the AgTi. Consequently, PEDOT can contact the titanium indirectly via the silver and the AgTi. Other materials may be used in the connection site, for example, highly doped silicon or carbon based materials such as, graphite, graphene, CNT or amorphous carbon.

The invention claimed is:

1. A photovoltaic device (10) comprising:
   a first conducting layer (16),
   a second conducting layer (18) electrically insulated from the first conducting layer (16),
   a porous substrate (20) made of an insulating material arranged between the first and second conducting layers (16, 18),
   a light absorbing layer (1) comprising a plurality of grains (2) of a doped semiconducting material disposed on the first conducting layer (16) so that the grains are in electrical and physical contact with the first conducting layer, and
   a charge conductor (3) made of a charge conducting material partly covering the grains and arranged to penetrate through the first conducting layer (16) and the porous substrate such that a plurality of continuous paths (22) of charge conducting material is formed from the surface of the grains (2) to the second conducting layer (18), wherein
   the first conducting layer (16) comprises a conducting material, an oxide layer (28) formed on the surface of conducting material, and an insulating coating (29) made of an insulating material deposited on the oxide layer (28) so that the oxide layer and the insulating coating together electrically insulate said paths (22) from the conducting material of the first conducting layer (16).

2. The photovoltaic device (10) according to claim 1, wherein the thickness of said insulating coating (29) is larger than 10 nm, preferably larger than 50 nm, and most preferably larger than 100 nm.

3. The photovoltaic device (10) according to claim 1, wherein the thickness of said oxide layer (28) is larger than 10 nm.

4. The photovoltaic device (10) according to claim 1, wherein the oxide layer (28) and the insulating coating (29) have different morphology.

5. The photovoltaic device (10) according to claim 1, wherein the oxide layer (28) and the insulating coating (29) are made of different material.

6. The photovoltaic device (10) according to claim 1, wherein the conducting material of the first conducting layer (16) comprises a metal or a metal alloy, and the oxide layer (28) comprises a metal oxide.

7. The photovoltaic device (10) according to claim 1, wherein said insulating coating (29) is made of an oxide.

8. The photovoltaic device (10) according to claim 1, wherein said insulating coating (29) is selected from the group consisting of $TiO_2$, $Al_2O_3$, $ZrO_2$, MgO, CaO, $SiO_2$, aluminosilicate, and mixtures thereof.

9. The photovoltaic device (10) according to claim 1, wherein said insulating coating (29) comprises insulating particles made of an insulating material, and the diameter of the insulating particles is less than 200 nm, and preferably less than 100 nm.

10. The photovoltaic device (10) according to claim 1, wherein the insulating coating (29) is denser and has lower porosity than the oxide layer (28).

11. The photovoltaic device (10) according to claim 1, wherein said oxide layer (28) is formed by thermal treatment of the conducting material of the first conducting layer in an oxidizing environment.

12. The photovoltaic device (10) according to claim 1, wherein said insulating coating (29) is deposited on the oxide layer (28) by chemical deposition and/or deposition of particles of an insulating material.

13. The photovoltaic device (10) according to claim 1, wherein the first conducting layer (16) comprises conducting particles (24) made of said conducting material in electrical and physical contact with each other and the grains, and said oxide layer (28) is formed on the surfaces of the conducting particles, which surfaces are not in contact with the grains or any of the other conducting particles.

14. The photovoltaic device (10) according to claim 1, wherein said insulating coating (29) is deposited on the oxide layer (28) so that the oxide layer is covered with said insulating coating.

15. The photovoltaic device (10) according to claim 1, wherein the first conducting layer (16) is porous, and the charge conductor (3) is accommodated in pores of the first conducting layer (16), and in pores of the insulating substrate, so that the conducting paths are formed through the first conducting layer (16) and the insulating substrate (20).

\* \* \* \* \*